United States Patent
Izumi et al.

(10) Patent No.: US 6,798,032 B2
(45) Date of Patent: Sep. 28, 2004

(54) METAL FILM PATTERN AND MANUFACTURING METHOD THEREOF

(75) Inventors: Yoshihiro Izumi, Nara (JP); Yoshimasa Chikama, Kyoto (JP); Satoshi Kawashima, Saitama (JP); Takaharu Hashimoto, Saitama (JP); Itsuji Yoshikawa, Chiba (JP); Masaaki Ishikawa, Chiba (JP)

(73) Assignees: Sharp Kabushiki Kaisha, Osaka (JP); Meltex Inc., Tokyo (JP); Sumitomo Osaka Cemento Co., Ltd., Tokyo (JP)

( * ) Notice: Subject to any disclaimer, the term of this patent is extended or adjusted under 35 U.S.C. 154(b) by 0 days.

(21) Appl. No.: 10/454,599

(22) Filed: Jun. 5, 2003

(65) Prior Publication Data

US 2003/0207567 A1 Nov. 6, 2003

Related U.S. Application Data (62) Division of application No. 10/151,881, filed on May 22, 2002, now Pat. No. 6,627,544.

(30) Foreign Application Priority Data

May 22, 2001 (JP) ........................................ 2001-152635

(51) Int. Cl.[7] .............................................. H01L 31/00
(52) U.S. Cl. ..................................... 257/443; 438/678
(58) Field of Search ........................... 257/59, 72, 443, 257/448; 438/678–679; 349/38, 43

(56) References Cited

U.S. PATENT DOCUMENTS

| 5,198,389 A | 3/1993 | Van Der Putten et al. |
| 5,795,828 A | 8/1998 | Endo et al. |
| 6,054,172 A | 4/2000 | Robinson et al. |
| 6,054,173 A | 4/2000 | Robinson et al. |
| 6,326,303 B1 | 12/2001 | Robinson et al. |
| 6,518,557 B1 * | 2/2003 | Izumi et al. .............. 250/208.1 |
| 6,657,396 B2 * | 12/2003 | Nakada et al. ........... 315/169.1 |

FOREIGN PATENT DOCUMENTS

| JP | 2-83533 | * | 3/1990 | ......... G02F/1/1345 |
| JP | 4-232922 A | | 8/1992 | |
| JP | 2001-32086 A | | 2/2001 | |

OTHER PUBLICATIONS

U.S. patent application Ser. No. 10/151,881, filed May 22, 2002.

U.S. patent application Ser. No. 09/573,464, filed May 17, 2000 entitled "Method for Fabricating Electric Interconnections and Interconnection Substrate Having Electric Interconnections Fabricated by the Same Method".

* cited by examiner

Primary Examiner—David Nelms
Assistant Examiner—David Vu
(74) Attorney, Agent, or Firm—Nixon & Vanderhye P.C.

(57) ABSTRACT

A $SnO_2$ film having a prescribed pattern feature is formed on a substrate by a wet film-formation technology (e.g., sol-gel method). A Ni film is formed on the $SnO_2$ film by an electroless plating method. The electroless plating method is conducted in the presence of at least one sulfur-containing compound selected from the group consisting of thiosulfates, thiocyanates and sulfur-containing organic compounds.

20 Claims, 4 Drawing Sheets

METAL FILM PATTERN AND MANUFACTURING METHOD THEREOF

This application is a divisional of, and claims priority on, U.S. Patent application Ser. No. 10/151,881, filed May 22, 2002, now U.S. Pat. No. 6,627,544 which claims priority on JP 2001-152635, both of which are hereby incorporated herein by reference.

BACKGROUND OF THE INVENTION

1. Field of the Invention

The present invention relates to a metal film pattern and a manufacturing method thereof. A wiring substrate having the metal film pattern of the present invention formed thereon is utilized in various applications such as flat panel displays (e.g., liquid crystal display devices (LCDs), plasma display devices (PDPs), electrochromic display devices (ECDs) and electroluminescent display devices (ELDs)), two-dimensional image detectors, and various electric circuit boards. The metal film pattern of the present invention can also be used as a photomask.

2. Description of the Background Art

In flat panel displays including liquid crystal display devices (LCDs), a display material such as a liquid crystal material or discharge gas is interposed between a pair of substrates. The display material is driven by applying a voltage thereto. Electric wirings of a conductive material are formed on at least one of the substrates.

For example, in the active-matrix display, gate electrodes and data electrodes are arranged in a matrix on one of a pair of substrates having a display material interposed therebetween (i.e., an active matrix substrate). A thin film transistor (TFT) and a picture element electrode are provided at every intersection of the gate electrodes and the data electrodes. The gate electrodes and the data electrodes are normally formed from a metal material such as Ta, Al or Mo by using a vacuum film-formation method such as sputtering method.

The size of a mother substrate used in a manufacturing process of such a flat panel display is ever increasing, and formation of metal wirings (electric wirings) on a large-area substrate on the order of meters is increasingly demanded. However, forming metal wirings on such a large-area substrate by a conventional vacuum film-formation method is problematic in the following points: it is difficult to form metal films having a uniform thickness and quality; and a huge vapor film-formation apparatus and thus an enormous amount of investment in plant and equipment are required.

Moreover, a vapor film-formation apparatus such as a sputtering apparatus and CVD (Chemical Vapor Deposition) apparatus requires a large amount of electric power such as that for driving a vacuum pump, heating a substrate and generating plasma. Of course, energy consumption of the manufacturing apparatus is also increased with increase in size thereof.

Moreover, a metal wiring pattern must be formed by forming a metal film over the whole surface of a substrate by using a vapor film-formation apparatus and then etching away the most part of the metal film (i.e., unnecessary part of the metal film). This causes waste of the metal material (i.e., low material utilization rate). In particular, reduction in energy consumption in the manufacturing process and suppression of the waste of material resources (effective utilization of material resources) are recently strongly demanded due to environmental concerns.

One way to solve the above problems caused by the vacuum film-formation process is to form metal wirings by using a wet film-formation technology instead of a vacuum film-formation method. For example, Japanese Laid-Open Publication No. 4-232922 discloses a method for forming a metal film of Cu, Ni or the like on an underlying film by using a plating technology. In this method, a transparent electrode of ITO (Indium Tin Oxide) or the like is used as the underlying film. This method does not use a vacuum film-formation apparatus to form the metal film. This suppresses increase in investment for manufacturing facility and increase in energy consumption in the manufacturing process. Moreover, the metal film can be selectively formed only on the ITO film by a plating method. This suppresses the waste of the metal material.

In this case, the metal film is formed by the plating technology that does not use a vacuum film-formation apparatus. However, the ITO film serving as an underlying film for the metal film is still formed by a dry vacuum film-formation technology such as a sputtering method and vapor deposition method. Accordingly, the above problems involved in the vacuum film-formation process cannot completely be solved.

Japanese Laid-Open Publication No. 2001-032086 discloses a method for forming even an underlying oxide film (e.g., ITO film), i.e., an underlying film for the metal film, by using a wet film-formation technology. In other words, this publication discloses a method for forming both an oxide film serving as an underlying pattern and various metal films selectively formed thereon by a wet film-formation process. In this method, the underlying pattern (oxide film) is formed by using a sol-gel method, one of the wet film-formation technologies, and a metal film (e.g., a laminated film of Ni, Au and Cu) is selectively formed only on the oxide film by using a wet plating method.

The sol-gel method is a method for producing an oxide solid by producing a sol-gel solution by using an organic or inorganic compound of a metal and a solvent, applying the sol-gel solution to a substrate, promoting hydrolysis and polycondensation reaction of the compound on the substrate so as to solidify a sol into a gel, and heating the gel. The use of the sol-gel method enables the oxide film to be formed by merely applying a sol-gel solution to a substrate such as glass and baking the resultant substrate. This eliminates the need to use a vacuum film-formation apparatus as in the conventional example.

The use of a method in which a sol-gel solution is blended with a photosensitive (photopolymerizable or photodegradable) material in advance or a method utilizing a photolysis reaction of a gel film chemically modified with a chelating agent enables patterning of a sol-gel applied film by a photolithography technology. By optimizing the composition of a sol-gel solution and the conditions for application and baking processes facilitates formation of a thin oxide film having a thickness of 0.1 $\mu$m or less and even a fine pattern having a line and space (L/S) of 10 $\mu$m or less. Therefore, an oxide film formed by the sol-gel method is optimal as an underlying film for a metal wiring pattern.

Note that, in the specification, the following method for forming an oxide film also falls within the category of the sol-gel method in a broad sense: in order to improve the stability of a sol in the atmosphere, a metal chelate complex solution with its hydrolysis and polycondensation reaction suppressed is used as a solution to be applied to the substrate, and an oxide film is formed by thermal decomposition of the metal chelate complex film.

The inventors formed metal wirings by an electroless nickel (Ni) plating method on an oxide film formed by a sol-gel method. In this experimentation, the inventors found that the metal film is deposited outside the pattern depending on the composition of the electroless nickel plating solution and such deposition outside the pattern is remarkable in a fine line pattern portion, and particularly in a portion having a line-space of 10 μm or less. When such deposition outside the pattern occurs in fine wirings, the insulating property between patterns is degraded, and in a worse case, short-circuiting occurs. Accordingly, deposition outside the pattern must be eliminated as much as possible upon forming the metal wirings.

It is an object of the present invention to prevent deposition of a metal film outside the pattern from occurring in a fine line pattern portion, and particularly in a portion having a line-space of 10 μm or less, when a metal film pattern is formed by an electroless plating method.

SUMMARY OF THE INVENTION

According to one aspect of the present invention, a method for manufacturing a metal film pattern includes the steps of: forming an oxide film having a prescribed pattern feature on a substrate by a wet film-formation technology; and forming a metal film on the oxide film by an electroless plating method. The electroless plating method is conducted in the presence of at least one sulfur-containing compound selected from the group consisting of thiosulfates, thiocyanates and sulfur-containing organic compounds. According to the present invention, deposition outside the pattern is prevented even when the oxide film pattern formed by, e.g., a sol-gel method is a fine pattern having a line and space (L/S) of 10 μm or less. As a result, a metal film can be formed on the oxide film in an excellent manner.

In the manufacturing method of the present invention, the sulfur-containing compound preferably has a concentration of 0.001 mg/L to 20 mg/L. Since the sulfur-containing compound is present at 0.001 mg/L or more in an electroless plating solution, deposition outside the pattern can be effectively suppressed in the electroless plating process. Moreover, since the sulfur-containing compound is present at 20 mg/L or less in the electroless plating solution, the oxide film pattern can be reliably plated with the metal film without causing significant reduction in metal deposition rate and stopping of the plating.

In the manufacturing method of the present invention, the oxide film is preferably formed using a photosensitive sol-gel solution. The method preferably further includes the step of patterning the oxide film with a prescribed feature by a photolithography technology. This enables a fine pattern having a line and space (L/S) of 10 μm or less to be formed by a simple process.

According to another aspect of the present invention, a metal film pattern having a prescribed feature has a laminated structure of an oxide film formed by a wet film-formation technology and a sulfur-containing metal film formed thereon.

In the metal film pattern of the present invention, deposition outside the pattern is prevented even when the oxide film pattern formed by, e.g., a sol-gel method is a fine pattern having a line and space (L/S) of 10 μm or less. As a result, a metal film is formed on the oxide film in an excellent manner. This prevents short-circuiting caused by deposition outside the pattern. Moreover, the metal film pattern of the present invention can be manufactured without using a vacuum film-formation apparatus. This enables increase in investment in manufacturing facility relating to film formation and increase in energy consumption in the manufacturing process to be suppressed even when a large-area substrate is used. Since the metal film pattern of the present invention need not have vacuum-resistant and heat-resistant properties, an insulating substrate of an organic material (e.g., polymer film) can be used in addition to a glass substrate. This enables the metal film pattern of the present invention to be efficiently manufactured by using a very long film base material and a roll-to-roll method. The metal film pattern of the present invention can be selectively formed by a plating method on the oxide film formed by a wet film-formation technology (e.g., sol-gel method). This suppresses waste of a metal material. Accordingly, a wiring substrate that can be used in various applications such as flat panel displays, two-dimensional image detectors and various electric circuit boards can be provided inexpensively.

According to still another aspect of the present invention, a display device uses a wiring substrate having the metal film pattern of the present invention formed thereon. Accordingly, short-circuiting caused by deposition outside the pattern is prevented. Moreover, a display device capable of being manufactured at low costs and applicable to a large-area substrate can be provided.

According to yet another aspect of the present invention, an electroless plating solution for forming a metal film on an oxide film formed by a wet film-formation technology contains at least one sulfur-containing compound selected from the group consisting of thiosulfates, thiocyanates and sulfur-containing organic compounds. The electroless plating solution of the present invention is suitable for manufacturing of the metal film pattern of the present invention.

DETAILED DESCRIPTION OF THE PREFERRED EMBODIMENTS

Figure 1:
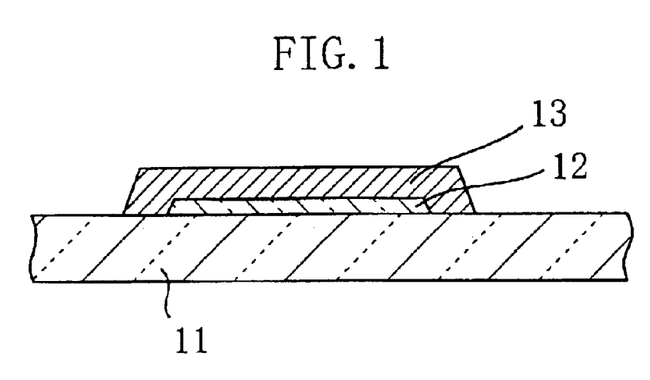
FIG. 1 is a schematic cross-sectional view of a metal film pattern according to a first embodiment of the present invention.

Hereinafter, embodiments of the present invention will be described with reference to the accompanying drawings. FIG. 1 is a schematic cross-sectional view of a metal film pattern according to an embodiment of the present invention. The metal film pattern of the present embodiment is formed on a substrate 11 and has a laminated structure of an oxide film 12 formed by a wet film-formation technology and a metal film 13 formed thereon. The metal film pattern of the present embodiment can be manufactured by the steps described below. Note that not only an inorganic substrate such as a glass substrate, ceramic substrate, and semiconductor substrate (or conductive substrate) having an insulating layer on its surface, but also an organic substrate (or film) such as PET (polyethylene terephthalate), ABS (acrylonitrile-butadiene-styrene copolymer) and PC (polycarbonate) may be used as the substrate 11.

Step of Forming an Oxide Film

In this step, the oxide film 12 is formed on the substrate 11 by a wet film-formation technology. The wet film-formation technology collectively refers to film-formation technologies different from a dry film-formation technology such as a sputtering method and CVD method. For example, the wet film-formation technology includes: a sol-gel method; a chemical deposition method and a liquid-phase deposition method which are conducted in an aqueous solution; a method for forming a film by applying a solution or resin having fine oxide particles dispersed therein; a CMD (Chemical Mist Deposition) method using mist of a solution; and a spray method.

The sol-gel method is a method for producing an oxide solid by producing a sol-gel solution by using an organic or inorganic compound of a metal and a solvent, applying the sol-gel solution to a substrate, promoting hydrolysis and polycondensation reaction of the compound on the substrate so as to solidify a sol into a gel, and heating the gel. Normally, a gel film is likely to become a porous matter (xerogel) by a drying process. Therefore, the dried gel film is likely to have fine pores extending in a reticulated manner. Any type of film ranging from a porous film having fine pores extending in a reticulated manner to a dense film having fewer pores can be formed by changing the composition of the sol-gel solution and the conditions for the baking process. The use of the sol-gel method enables an oxide film to be formed by merely applying a sol-gel solution on a substrate such as glass and baking the resultant substrate. This eliminates the need to use a vacuum film-formation apparatus as in the conventional example.

The chemical deposition method is a method for depositing an oxide film on a substrate by immersing the substrate in an aqueous solution. The chemical deposition method uses a redox (oxidation-reduction) reaction in the aqueous solution. The chemical deposition method includes an anode deposition method and a cathode deposition method. The use of an oxidizing agent and a reducing agent in the chemical deposition method enables an oxide film to be deposited on the substrate in an electroless manner. For example, when a substrate having a catalyst adhering thereto is immersed in an aqueous solution containing both a nitrate of a metal and a reducing agent (e.g., dimethylamine borane (DMAB)), electrons supplied from the reducing agent drive the reduction reaction between nitric acid and nitrous acid. As a result, a metal oxide film (or hydroxide film) is deposited.

Another method for forming an oxide film in an aqueous solution is a liquid-phase deposition (LPD) method. The liquid-phase deposition method is a method for depositing an oxide film on a substrate by using a hydrolysis equilibrium reaction of a metal fluoro complex or hydrosilicofluoric acid.

The use of such a chemical deposition method or a liquid-phase deposition method enables an oxide film to be formed by merely immersing a substrate in an aqueous solution. In other words, an oxide film can be formed without using a vacuum film-formation apparatus.

The method for forming a film by applying a solution or resin having fine oxide particles dispersed therein is a method for forming a film on a substrate by, e.g., spin-coating ultrafine particles (particles having a primary particle size of about 0.01 $\mu$m to about 0.1 $\mu$m) dispersed in a binder. For example, the ultrafine particles may be particles of a transparent, conductive oxide, and the binder may be a photosensitive resist. In this method, an applied film is baked at such a temperature that does not cause thermal decomposition of the binder, thereby causing a volume change of the binder (i.e., resist resin) such as contraction. As a result, the dispersed ultrafine particles are brought into contact with each other and exhibit capability as a transparent, conductive oxide film. Note that a film formed by this method is not a pure oxide film but a mixed film of the binder and the ultrafine oxide particles. In the specification, however, it is assumed that such a mixed film falls within the definition of the oxide film in a broad sense.

The following method for forming an oxide film is also applicable in the present embodiment: in order to improve the stability of a sol in the atmosphere, a metal chelate complex solution with its hydrolysis and polycondensation reaction suppressed is used as a solution to be applied to a substrate, and an oxide film is formed by thermal decomposition of the metal chelate complex film.

The oxide film 12 thus formed by the wet film-formation technology is then patterned into a prescribed wiring feature (patterning step). The patterning step is commonly conducted by forming a prescribed resist pattern on the oxide film by a technology such as photolithography and then removing an unnecessary portion of the oxide film by wet etching or dry etching. For example, HBr or a ferric chloride solution can be used to etch an ITO film. Zinc catalyst and hydrochloric acid can be used to etch a $SnO_2$ film.

When the oxide film is formed by a sol-gel method, it is possible to pattern the oxide film without using a resist. This is achieved by causing the oxide film itself to have a photosensitive property. For example, when a gel film is formed by using a metal alkoxide chemically modified with a chelating agent such as acetylacetone (AcAc) and benzoylacetone (BzAc), solubility of the gel film is significantly varied by ultraviolet (UV) radiation. The gel film subjected to UV radiation no longer has a chelate bond. As a result, the gel film is insolubilized in an alkaline solution and alcohol. Conducting exposure, development and baking processes of the gel film based on this principle simplifies patterning of the oxide film. A normal gel film having no chemical modification may be used. In this case, the gel film may be patterned by decomposing the gel film by excimer laser radiation.

It is also possible to apply a photosensitive property to a sol-gel solution by blending the sol-gel solution with a photosensitive (photopolymerizable or photodegradable) resin at an appropriate ratio. For example, when UV light is radiated to a precursor film of a sol-gel solution blended with a photopolymerizable monomer (e.g., acrylic monomer) and a polymerization initiator, the monomer is polymerized into a mesh-like polymer (polymer network) and the sol-gel solution is present in the space within the polymer network. In the subsequent development process, only the polymerized portion of the film (i.e., the UV-irradiated portion) remains as a negative pattern, and the non-polymerized monomer and the sol-gel solution in the non-irradiated portion dissolve in a developer. Thereafter, a baking process is conducted at about 500° C. to remove a residual organic matter within the polymer network and the sol-gel solution. A pattern of the sol-gel oxide film is thus completed. In this case, a commercially available negative photoresist may be used as the photosensitive resin.

Examples of the oxide film formed by the wet film-formation technology include transparent, conductive oxide films such as ZnO and $In_2O_3$, in addition to the ITO film and $SnO_2$ film.

Step of Forming a Metal Film

In this step, the metal film 13 is formed by an electroless plating method on the oxide film 12 obtained by the above step. Examples of a metal that can be used in the electroless plating method include nickel, cobalt, tin, gold, copper, silver and palladium.

Before the metal film is formed, an electroless plating catalyst (e.g., palladium catalyst) is deposited only on the oxide film 12. A method for applying an electroless plating catalyst is not specifically limited. For example, the palladium catalyst can be selectively deposited only on the oxide film 12 by an activating process using a $PdCl_2$ solution, a sensitizing-activating process using a $SnCl_2$ solution and a $PdCl_2$ solution, a catalyst-accelerator process using a mixed solution of Pd and Cl and an acidic or alkaline solution (accelerating solution), or the like.

When the oxide film 12 is formed by a sol-gel method, the above process of applying a catalyst may be omitted by using a sol-gel solution containing a catalyst such as Pd or forming the oxide film 12 mainly containing PdO.

Before the catalyst is applied, the surface of the oxide film 12 is commonly slightly roughed with a fluoride-containing solution. However, when the oxide film 12 formed by a sol-gel method or the oxide film 12 formed by a chemical deposition method or a liquid-phase deposition method is used, this roughing process can be omitted. This is because the oxide film 12 formed by a sol-gel method has a relatively porous structure, and the oxide film 12 formed by a chemical deposition method or a liquid-phase deposition method has an extremely irregular surface.

After the plating catalyst is thus selectively applied to a region where the oxide film 12 is present, the metal film 13 can be deposited by an electroless selective plating method. This is conducted based on the fact that a metal catalyst such as Pd is selectively adsorbed on the oxide film in the pretreatment (the process of applying a catalyst).

However, as a result of various experiments, the inventors found that the metal film is deposited outside the pattern depending on the composition of an electroless nickel plating solution and such deposition outside the pattern is remarkable in a fine line pattern portion, and particularly in a portion having a line-space of 10 μm or less. This degrades the insulating property between patterns. The reason why such deposition outside the pattern occurs is not clearly understood, but can be considered as follows: an extremely small amount of catalyst (e.g., Pd) remains in the space between patterns of the oxide film (i.e., space portion) in the process of selectively applying a plating catalyst to the oxide film. The inventors also found that this tendency is remarkable particularly when the oxide film is formed by a sol-gel method and when the oxide film containing Sn (e.g., $SnO_2$ film or ITO film) is formed.

Figure 2:
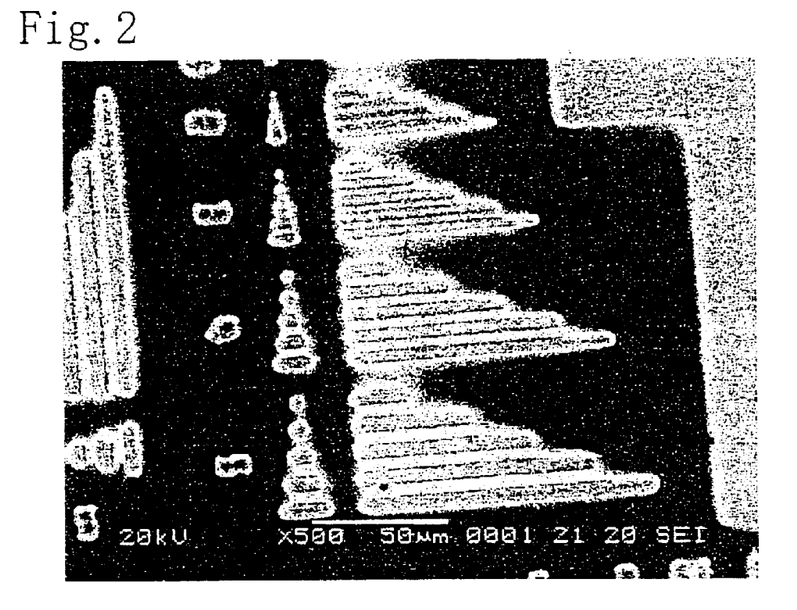
FIG. 2 is an electron micrograph showing the state after fine patterns of a $SnO_2$ film are subjected to electroless nickel (Ni) plating by using an electroless Ni plating solution having no sulfur-containing compound added thereto (comparative example)

FIG. 2 is an electron micrograph showing the state after the fine patterns of a $SnO_2$ film formed by a sol-gel method are subjected to electroless nickel plating. Note that FIG. 2 sequentially shows the fine patterns having a line and space (L/S) of 5 μm, 4 μm, 3 μm and 2 μm from bottom to top. As can be seen from FIG. 2, deposition of the Ni film outside the pattern is remarkable for every fine pattern.

Figure 3:
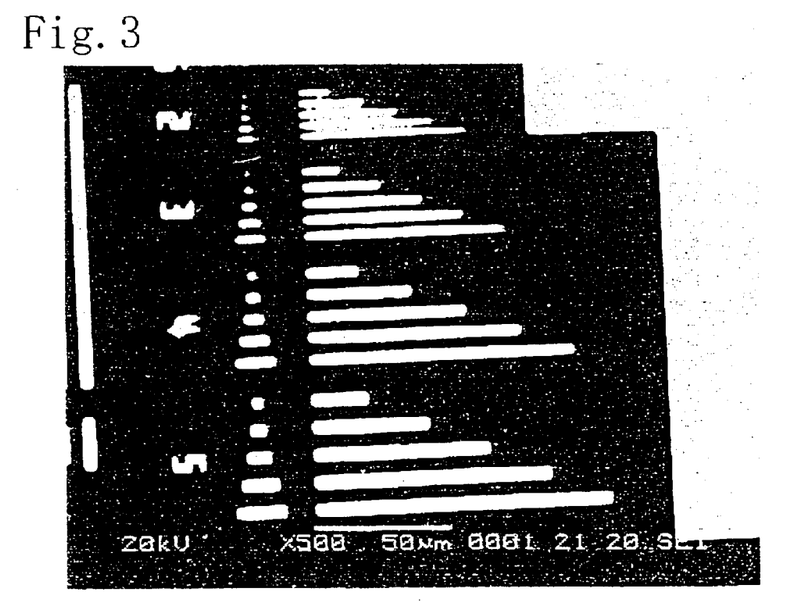
FIG. 3 is an electron micrograph showing the state after fine patterns of a $SnO_2$ film are subjected to electroless Ni plating by using an electroless Ni plating solution having a sulfur-containing compound added thereto (present invention)

In the present embodiment, the fine patterns of the $SnO_2$ film were subjected to electroless nickel plating in the presence of a sulfur-containing compound. FIG. 3 is an electron micrograph showing the resultant state. As can be seen from FIG. 3, slight deposition outside the pattern is recognized for the line and space (L/S) of 2 μm, but deposition outside the pattern is suppressed for the line and space (L/S) of 5 μm, 4 μm and 3 μm.

Examples of the sulfur-containing compound used herein include thiosulfates such as sodium thiosulfate, thiocyanates such as potassium thiocyanate, and sulfur-containing organic compounds. Examples of the sulfur-containing organic compounds include mercaptocarboxylic acids such as mercaptoacetic acid and mercaptosuccinic acid, amino acids such as cystine and methionine, 2-mercaptoethanol, thiols such as 2-aminoethanethiol, thiourea and derivatives thereof, thiocarboxylic acids, thiophene-based compounds, benzothiophene-based compounds, thiazole compounds, benzothiazole compounds, and thiadiazole compounds.

At least one sulfur-containing compound selected from the group consisting of thiosulfates, thiocyanates and sulfur-containing organic compounds can be used in the present invention.

These sulfur-containing compounds effectively act from the concentration of about 0.001 mg/L. However, in view of the consumption within a plating solution, the actual lower limit of the concentration in the plating solution is about 0.1 mg/L, and preferably about 0.5 mg/L. As the concentration of the sulfur-containing compound is increased, the plating deposition rate is reduced, and plating stops at a certain concentration or more. The concentration that stops plating significantly varies depending on the type of sulfur-containing compound, but 20 mg/L is considered to be the upper limit. Therefore, the upper limit of the concentration is preferably set to 10 mg/L.

An electroless plating solution of the present invention contains the above sulfur-containing compound(s), and is prepared so that the concentration of the sulfur-containing compound(s) falls within the above range in the electroless plating process. The electroless plating solution of the present invention mainly contains a metal-supplying salt, an organic acid for complexing the metal-supplying salt, a reducing agent and the like, in addition to the sulfur-containing compound(s). The electroless plating solution of the present invention additionally contains heavy metal ions, an organic compound, a surfactant and the like in order to improve bath stability and physical properties of a film. The electroless plating solution used in the present embodiment mainly contains nickel sulfate as a metal-supplying salt, an organic acid for complexing nickel ions, and sodium hypophosphite as a reducing agent. The electroless plating solution used in the present embodiment additionally contains heavy metal ions, an organic compound, a surfactant and the like in order to improve bath stability and physical properties of a film. The electroless plating solution of the present invention is normally diluted and adjusted in pH before use.

Note that an electroless plating solution containing no sulfur-containing compound may be used for the electroless plating process. In this case, a separately prepared sulfur-containing compound is added to the plating solution.

When the electroless plating process is conducted in the presence of a sulfur-containing compound, sulfur elements are introduced into the nickel film. Sulfur elements within a metal film can be detected by an Auger electron spectroscopy (AES) apparatus, secondary ion mass spectrometry (SIMS) or the like.

Since the above electroless nickel plating solution contains sodium hypophosphite, phosphorus elements are introduced into the nickel film. Accordingly, the resultant Ni film is a Ni—P eutectoid film in a strict sense. In the present invention, a film having a Ni composition ratio of 50% or more is referred to as Ni film for convenience.

Hereinafter, embodiments of a metal wiring formed on an insulating substrate by a manufacturing method of a metal film pattern according to the present invention will be described. Note that the manufacturing method of the metal film pattern according to the present invention is applicable not only to manufacturing of a metal wiring but also manufacturing of a photomask.

First Embodiment

A metal wiring according to the first embodiment will now be described with reference to FIG. 1. In this metal wiring, a Ni film 13 is formed on the pattern of a $SnO_2$ film 12 on an insulating substrate 11 by an electroless selective plating method. This metal wiring is manufactured by the following procedures:

Step of Forming a Sol-Gel Oxide Film Pattern

First, the surface of a glass substrate (#1737 made by Corning Incorporated) is degreased and cleaned with an alkali, acid, or organic solvent. It is effective to conduct ultrasonic cleaning simultaneously. As a wiring underlying layer, a $SnO_2$ film 12 having a prescribed wiring feature is patterned on the surface of the insulating substrate 11 by a sol-gel method. The $SnO_2$ film 12 can be easily patterned on the substrate 11 by blending a sol-gel solution with a negative photosensitive resin, a photopolymerizable material, and conducting a series of photolithography processes such as application of the sol-gel solution, pre-baking, pattern exposure, development and baking. More specifically, a photomask having a prescribed pattern is placed over an applied film of the sol-gel solution. The resultant substrate is then exposed to UV light. Thereafter, the substrate is developed with a solution of an organic alkali such as tetramethylammonium hydroxide (TMAH) or an inorganic alkali such as sodium carbonate for patterning. The patterned film thus obtained is then baked for thirty to sixty minutes at 400° C. or higher, and preferably at 450° C. to 550° C. An underlying oxide film pattern mainly containing $SnO_2$ is thus formed. The $SnO_2$ film merely serves as an underlying film for a plating film. Therefore, the $SnO_2$ film may have a very small thickness. The $SnO_2$ film is formed so as to have a thickness of 0.1 µm or less, and preferably 0.02 µm to 0.05 µm, after the baking process.

Note that the wiring underlying film is not limited to the $SnO_2$ film, but another oxide film such as ITO film may alternatively be used. However, when Pd is used in the subsequent step (step of applying a catalyst), the $SnO_2$ film and the ITO film containing a Sn component are suitable in view of their characteristics for Pd addition.

Step of Applying a Plating Catalyst

A plating catalyst is selectively applied to the wiring underlying layer ($SnO_2$ pattern). A common method for applying a plating catalyst is as follows: first, the surface of the $SnO_2$ film is slightly roughed with a fluoride-containing solution. However, when the $SnO_2$ film formed by a sol-gel method is used as in the present embodiment, this roughing process can be omitted. This is because the $SnO_2$ film itself has a relatively porous structure. The $SnO_2$ film is then immersed in a palladium chloride solution as an activation process. A Pd catalyst that will serve as a catalyst of the electroless plating process can thus be deposited only on the $SnO_2$ film.

For example, a substrate having a $SnO_2$ film pattern is immersed in a solution of Melplate activator 7331 (made by Meltex Inc.) diluted to 30 mL/L for about five minutes and then washed with pure water.

Electroless Plating Step

A Ni film having a thickness of about 0.2 µm is selectively formed only on the $SnO_2$ film by an electroless plating process. This $SnO_2$ film has the Pd catalyst applied thereto in the previous step. An electroless Ni plating solution used herein contains a sulfur-containing compound in addition to the primary components such as nickel sulfate as a metal-supplying salt, an organic acid for complexing nickel ions, and sodium hypophosphite as a reducing agent. The use of such an electroless Ni plating solution enables a Ni film to be selectively formed only on the $SnO_2$ pattern.

For example, an electroless nickel plating solution containing about 1 mg/L of sodium thiosulfate as shown in Table 1 below is adjusted to pH 4.5, and the substrate having a $SnO_2$ film pattern thereon is immersed therein for about five minutes at 70° C. As a result, a clean Ni film pattern is formed on the fine patterns of the $SnO_2$ film without causing any deposition outside the pattern, as shown in FIG. 3.

TABLE 1

| Composition of Electroless Plating Solution | |
|---|---|
| Nickel sulfate | 0.1 mol/L |
| Sodium hypophosphite | 0.3 mol/L |
| Malic acid | 0.1 mol/L |
| Succinic acid | 0.1 mol/L |
| Lead | 0.5 mg/L |
| Sodium thiosulfate | 1 mg/L |

The resultant substrate is then annealed for about thirty minutes at 250° C. to 270° C. As a result, a Ni film pattern having an excellent adhesion property, that is, a Ni metal wiring, is obtained.

Sodium thiosulfate in the electroless nickel plating solution in Table 1 was replaced with another sulfur-containing compound, and the resultant Ni metal film was examined. In this case, the Ni film was deposited on the fine patterns of the $SnO_2$ film as shown in Table 2 below.

TABLE 2

| Compound | Concentration | Plating Deposition |
|---|---|---|
| Thiocyanates: | | |
| Potassium thiocyanate | 0.5 mg/L | No deposition outside the pattern |
| Potassium thiocyanate | 1 mg/L | No deposition outside the pattern |
| Potassium thiocyanate | 2 mg/L | No deposition outside the pattern |
| Potassium thiocyanate | 4 mg/L | No deposition outside the pattern |
| Potassium thiocyanate | 8 mg/L | Plating stopped |
| Sulfur-containing organic compounds (with —SH): | | |
| Mercaptoacetic acid | 1 mg/L | No deposition outside the pattern |
| Mercaptopropionic acid | 1 mg/L | No deposition outside the pattern |
| Thiomalic acid | 1 mg/L | No deposition outside the pattern |
| Sulfur-containing organic compounds (with =SH): | | |
| Thiourea | 1 mg/L | No deposition outside the pattern |
| Ethylene thiourea | 1 mg/L | No deposition outside the pattern |
| Sulfur-containing organic compounds (aromatic compounds with —SH): | | |
| Thiosalicylic acid | 0.5 mg/L | No deposition outside the pattern |
| Thiosalicylic acid | 1 mg/L | No deposition outside the pattern |
| Thiosalicylic acid | 2 mg/L | No deposition outside the pattern |
| Thiosalicylic acid | 4 mg/L | No deposition outside the pattern |
| Thiosalicylic acid | 8 mg/L | No deposition outside the pattern |
| Sulfur-containing organic compounds (heterocyclic compounds with —SH): | | |
| Mercaptopyrimidine | 1 mg/L | No deposition outside the pattern |
| 2-mercaptobenzoxazole | 1 mg/L | No deposition outside the pattern |

TABLE 2-continued

| Compound | Concentration | Plating Deposition |
|---|---|---|
| Sulfur-containing organic compounds (heterocyclic compounds with =S): | | |
| 6-methyl-2-thiouracil | 1 mg/L | No deposition outside the pattern |
| Sulfur-containing organic compounds (heterocyclic compounds with —S— in a ring): | | |
| Thiazolidine-4-carboxylic acid | 1 mg/L | No deposition outside the pattern |
| Rhodanine (Comparative Examples) | 1 mg/L | No deposition outside the pattern |
| Sodium sulfite | 1 mg/L | Deposited outside the pattern |
| Sodium sulfate | 1 mg/L | Deposited outside the pattern |

Second Embodiment

In the metal wiring of the first embodiment, the Ni film is used as a metal film. However, the resultant Ni film is a eutectoid film of Ni and P, and has a relatively high electric resistance. Accordingly, the metal wiring of the first embodiment can be used as an electric wiring only in a limited range of applications. A metal wiring described in the second embodiment corresponds to the metal wiring of the first embodiment having a reduced resistance.

Figure 4:
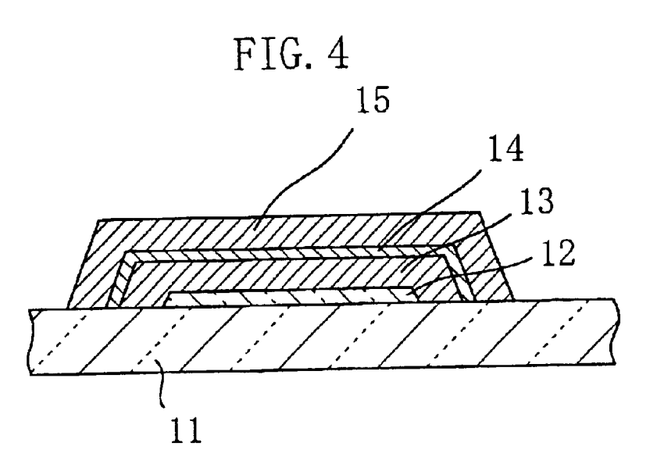
FIG. 4 is a schematic cross-sectional view of a metal wiring according to a second embodiment of the present invention.

FIG. 4 is a schematic cross-sectional view of the metal wiring of the second embodiment having a reduced resistance. As shown in FIG. 4, laminating Au and Cu on the metal wiring of the first embodiment enables reduction in resistance.

More specifically, by a displacement plating method, Au (anti-corrosion, low-resistance metal) is selectively formed on the surface of the metal film (Ni film) obtained in the first embodiment. For example, Melplate AU-601 made by Meltex Inc. may be used. In this case, a substrate having the metal wiring of the first embodiment formed thereon is immersed in a solution of 90° C. and pH 4.5 for about five minutes, whereby a displaced Au film 14 having a thickness of about 0.01 $\mu$m is deposited.

The resultant substrate may further be plated with a thick Au film in order to further reduce the resistance of the metal wiring. However, since Au is an expensive noble metal material, further reducing the resistance of the metal film by Au is not preferable from an economic point of view. It is preferable to laminate a Cu film 15 on the displaced Au plating film 14 to inexpensively reduce the resistance of the metal wiring. For example, Melplate Cu-390 made by Meltex Inc. may be used. In this case, the substrate having the Au/Ni film pattern formed thereon is immersed in an electroless Cu plating solution of 40° C. and pH 13.5 for about thirty minutes, whereby a Cu film 15 having a thickness of about 0.15 $\mu$m is selectively deposited.

Alternatively, the Cu film 15 may be deposited directly on the Ni film 13 by a plating method without forming the Au film 14. The Au film 14 and the Cu film 15 can be selectively formed on the underlying Ni film 13 even by an electroplating method.

The metal wiring thus obtained can be used as an electric wiring having an extremely low resistance due to the presence of the Cu film 15. Therefore, a wiring substrate having this metal wiring can be used in a wide range of applications. For example, a metal electrode formed from a lamination of the SnO$_2$ film 12 (thickness: 0.05 $\mu$m), Ni film 13 (thickness: 0.2 $\mu$m), Au film 14 (thickness: 0.01 $\mu$m) and Cu film 15 (thickness: 0.15 $\mu$m) had a sheet resistance of about 0.2 Ω/□ (ohms per square). In the peel test using an adhesive tape, this film was not separated from the substrate and exhibited a strong adhesion property. Accordingly, a wiring substrate having this metal wiring can be used in applications such as flat panel displays (such as liquid crystal display devices (LCDs), plasma display devices (PDPs), electrochromic display devices (ECDs) and electroluminescent display devices (ELDs)), two-dimensional image detectors, and various electric circuit boards.

Third Embodiment

Figure 5:
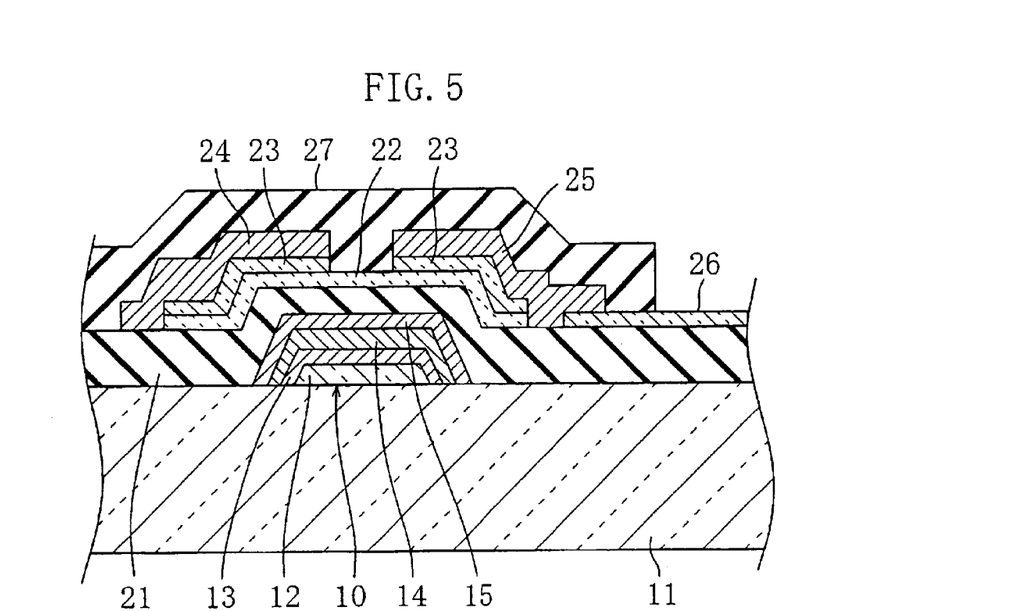
FIG. 5 is a schematic cross-sectional view of a thin film transistor (TFT) according to a third embodiment of the present invention.

FIG. 5 is a schematic cross-sectional view of a thin film transistor (TFT) formed by using a wiring substrate (more specifically, active matrix substrate) having the metal wiring of the second embodiment. A gate wiring (including a gate electrode) 10 on a glass substrate 11 is a lamination of a sol-gel SnO$_2$ film 12 (thickness: 0.05 $\mu$m) as a wiring underlying layer, a Ni film 13 (thickness: 0.2 $\mu$m), an Au film 14 (thickness: 0.01 $\mu$m) and a Cu film 15 (thickness: 0.15 $\mu$m). This lamination has a sheet resistance of about 0.2 Ω/□ (ohms per square). A gate insulating film 21 of SiN$_x$ is formed on the gate wiring 10 by a CVD method. An a-Si film 22 as a channel portion, an n$^+$-type a-Si film 23 as a contact layer, a source electrode 24, a drain electrode 25, a picture element electrode 26, and an insulating protection film 27 are formed on thereon. The source electrode 24 and the drain electrode 25 are formed from Al (or Ta, Mo or the like). The picture element electrode 26 is formed from ITO, and the insulating protection film 27 is formed from SiN$_x$ or an organic insulating film.

It was confirmed that the TFT element thus produced has approximately the same characteristics as those of a TFT element using a gate wiring formed only by a conventional dry film-formation method, and that the metal film pattern of the present invention is applicable to an active matrix LCD.

Note that, although the TFT having an inverted staggered structure (bottom gate structure) is shown in the present embodiment, the wiring substrate of the present invention is also applicable to a TFT having a staggered structure (top gate structure). The wiring substrate of the present invention is applicable not only to the gate wiring but also the source/drain electrodes.

Figure 6:
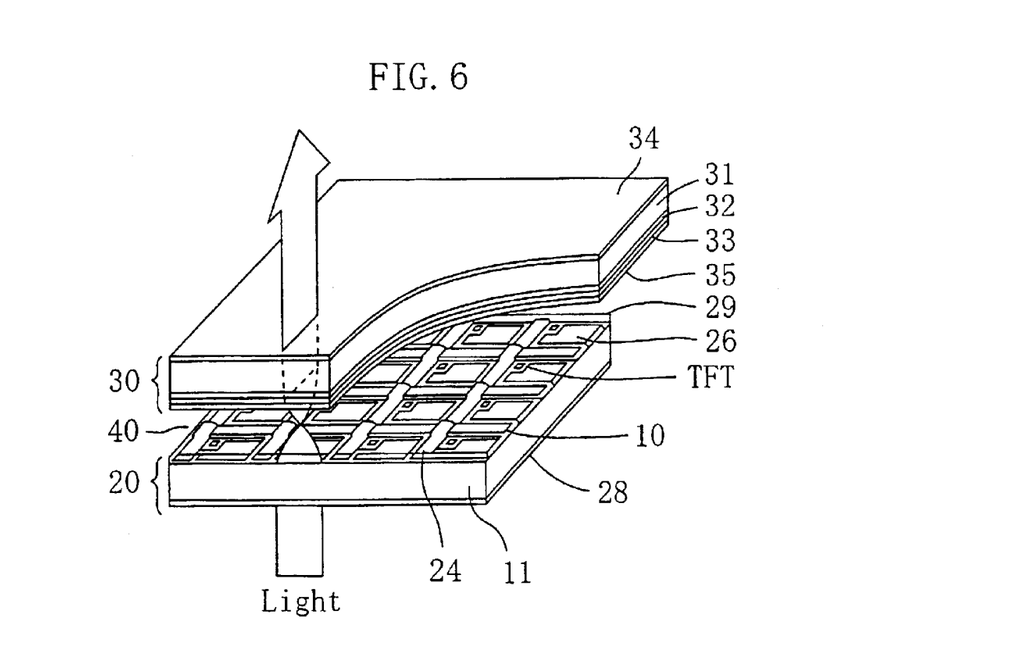
FIG. 6 is a perspective view showing the structure of an active matrix LCD using the TFTs of the third embodiment.

A liquid crystal display device (LCD) was fabricated using an active matrix substrate having the TFT elements in FIG. 5. FIG. 6 is a perspective view showing the structure of the active matrix LCD. The active matrix LCD has an active matrix substrate 20, a counter substrate 30 facing the active matrix substrate 20, and a liquid crystal layer 40 interposed therebetween. The active matrix substrate 20 has gate electrodes 10 and source electrodes 24 arranged in a matrix on a glass substrate 11. A TFT and a picture element electrode 26 are provided on the glass substrate 11 at every intersection of the gate electrodes 10 and the source electrodes 24. A polarizing plate 28 is laminated on the outer surface of the glass substrate 11. The counter substrate 30 has a color filter layer 32 and a counter electrode 33 on a glass substrate 31, and a polarizing plate 34 is laminated on the outer surface of the glass substrate 31. Alignment layers 29, 35 are formed on the respective surfaces of the substrates 20, 30 so as to face the liquid crystal layer 40. A transmission-type LCD can be implemented by using transparent electrodes as picture element electrodes 26 of this active matrix LCD, and a reflection-type LCD can be implemented by using reflecting electrodes as picture element electrodes 26 of this active matrix LCD. It was confirmed that this active matrix LCD has the same display capability as that of the conventional example.

Although the TFT elements have been described in the present embodiment, the wiring substrate of the present invention is also applicable to an active matrix substrate using MIM (Metal Insulator Metal), BTB (Back-to-Back diode), diode ring, varistor, plasma switching or the like. This active matrix substrate is broadly applicable to display devices and image detectors. The wiring substrate of the present invention is also applicable to a wiring substrate having no active element, and a passive matrix display device can be fabricated using that wiring substrate. Moreover, the wiring substrate of the present invention is applicable to display devices using an optical medium other than the liquid crystal material as a display medium, e.g., all display devices that require electric wirings such as plasma display devices (PDPs), inorganic or organic EL (electroluminescent) display devices, electrochromic display devices (ECDs), and electrophoretic display devices.

The wiring substrate of the present invention is applicable not only to the above display devices but also to various electric wirings such as power supply lines of flat panel display devices, a two-dimensional image detector having a flat panel shape, and driver circuitry formed on the peripheral region of the same substrate in a monolithic manner (or COG (Chip On Glass) or TAB (Tape Automated Bonding) mounted thereon). In the metal film pattern of the present invention, deposition outside the pattern which may occur in a fine wiring is suppressed. Therefore, a wiring substrate using this metal film pattern ensures the insulating property between patterns, whereby short-circuiting is prevented. This results in improved operation reliability of electronic equipments having the wiring substrate of the present invention.

The metal film pattern of the present invention can be used not only as a wiring substrate but also as a photomask. In the metal film pattern of the present invention, deposition outside the pattern which may occur in a fine line pattern portion is suppressed. Therefore, a photomask using the metal film pattern of the present invention enables a photolithography process to be conducted with high accuracy.

According to the manufacturing method of the metal film pattern of the present invention, deposition of the metal film outside the pattern is suppressed. Therefore, a wiring substrate using the metal film pattern of the present invention ensures the insulating property between patterns, whereby short-circuiting is prevented. This results in improved operation reliability of the electronic equipments. A photomask using the metal film pattern of the present invention enables a photolithography process to be conducted with high accuracy.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A metal film pattern having a prescribed feature, wherein the metal film pattern has a laminated structure of an oxide film formed by a wet film-formation technology and a sulfur-containing metal film formed thereon.

2. A display device using a wiring substrate having the metal film pattern according to claim 1 formed thereon.

3. The metal film pattern of claim 1, wherein the wet film-formation technology comprises a sol-gel solution technique, a chemical deposition technique, a liquid phase deposition technique, a technique for forming a film by applying a solution or resin having fine oxide particles dispersed therein, a chemical mist deposition technique, and/or a spray technique.

4. The metal film pattern of claim 1, wherein the oxide film comprises indium-tin-oxide, tin oxide, zinc oxide, and/or indium oxide.

5. The metal film pattern of claim 1, wherein the oxide film contains tin (Sn).

6. The metal film pattern of claim 1, wherein the metal film comprises nickel, cobalt, tin, gold, copper, silver and/or palladium.

7. The metal film pattern of claim 1, wherein the oxide film has a line and space (L/S) of 10 $\mu$m or less.

8. The metal film pattern of claim 1, wherein the oxide film has a line and space (L/S) of 5 $\mu$m or less.

9. The metal film pattern of claim 1, wherein the oxide film has a line and space (L/S) of 3 to 5 $\mu$m.

10. The metal film pattern of claim 1, wherein a film comprising gold (Au) is formed on the metal film.

11. The metal film pattern of claim 10, wherein the metal film comprises nickel.

12. The metal film pattern of claim 1, wherein a film comprising copper (Cu) is formed on the metal film.

13. The metal film pattern of claim 12, wherein the metal film comprises nickel.

14. The metal film pattern of claim 1, wherein a film comprising gold and a film comprising copper are formed in this order on the metal film.

15. The metal film pattern of claim 14, wherein the metal film comprises nickel.

16. A liquid crystal display device using a wiring substrate including the metal film pattern of claim 1 formed thereon.

17. A plasma display device using a wiring substrate including the metal film pattern of claim 1 formed thereon.

18. An electrochromic device using a wiring substrate including the metal film pattern of claim 1 formed thereon.

19. An electroluminescent display device using a wiring substrate including the metal film pattern of claim 1 formed thereon.

20. A two dimensional image detector using a wiring substrate including the metal film pattern of claim 1 formed thereon.

* * * * *